(12) United States Patent
Izumita et al.

(10) Patent No.: US 7,296,215 B2
(45) Date of Patent: Nov. 13, 2007

(54) SIGNAL PROCESSING METHOD AND SIGNAL PROCESSING CIRCUIT

(75) Inventors: Morishi Izumita, Tokyo (JP); Terumi Takashi, Kanagawa (JP); Hideki Sawaguchi, Tokyo (JP); Seiichi Mita, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 437 days.

(21) Appl. No.: 10/922,227

(22) Filed: Aug. 18, 2004

(65) Prior Publication Data

US 2005/0044468 A1  Feb. 24, 2005

(30) Foreign Application Priority Data

Aug. 18, 2003  (JP) ............................. 2003-207679

(51) Int. Cl.
*H03M 13/03* (2006.01)
(52) U.S. Cl. ..................... 714/794; 714/764; 714/752
(58) Field of Classification Search ................ 714/794, 714/193, 763, 782, 752, 764; 369/48; 360/48
See application file for complete search history.

(56) References Cited

U.S. PATENT DOCUMENTS

| | | | |
|---|---|---|---|
| 5,446,747 A | | 8/1995 | Berrou |
| 6,069,856 A | * | 5/2000 | Mita et al. ................ 369/47.19 |
| 6,611,939 B1 | * | 8/2003 | Noguchi ..................... 714/764 |
| 6,621,851 B1 | * | 9/2003 | Agee et al. ................. 375/130 |
| 7,146,552 B2 | * | 12/2006 | Kim et al. ................... 714/755 |
| 2001/0046099 A1 | * | 11/2001 | Hamai et al. ................. 360/48 |
| 2002/0073379 A1 | * | 6/2002 | Kuwano et al. ............. 714/812 |

FOREIGN PATENT DOCUMENTS

JP  2001-285080 A  10/2001

OTHER PUBLICATIONS

Conway, "A new target response with parity coding for high density magnetic recording channels," *IEEE Trans. Magn.*, 34(4):2382-2386 (1998).

* cited by examiner

*Primary Examiner*—Guy Lamarre
*Assistant Examiner*—Fritz Alphonse
(74) *Attorney, Agent, or Firm*—Townsend and Townsend and Crew LLP; Patrick Duncan

(57) ABSTRACT

In one embodiment, a symbol error correction encoder effects block interleaving on recording data and thereafter performs first error correction encoding on the recording data. Next, a symbol error correction encoder performs encoding on the whole block. A reproducing processing circuit outputs likelihood information of respective bits. A first error correction decoder corrects a random error produced upon recording and reproduction, using the likelihood information. Since it is possible to make an improvement in performance with respect to the random error by repetitive decoding at this time, the post-correction data is returned to the reproducing processing circuit. After the completion of such repetitive processing, the data is digitized and subjected to an error correction in symbol unit by a hard determination, and outputted to a symbol error correction decoder.

20 Claims, 4 Drawing Sheets

| 1 | 17 | 33 | | | | | | 225 | q1 | p1 |
|---|----|----|--|--|--|--|--|-----|----|----|
| 2 | 18 | 34 | | | | | | 226 | q2 | p2 |
| 3 | 19 | 35 | | | | | | 227 | q3 | p3 |
| 4 | 20 | 36 | | | | | | 228 | q4 | p4 |
| 5 | 21 | 37 | | | | | | 229 | q5 | p5 |
| 6 | 22 | 38 | | | | | | 230 | q6 | p6 |
| 7 | 23 | 39 | | | | | | 231 | q7 | p7 |
| 8 | 24 | 40 | | | | | | 232 | q8 | p8 |
| 9 | 25 | 41 | | | | | | 233 | q9 | p9 |
| 10 | 26 | 42 | | | | | | 234 | q10 | p10 |
| 11 | 27 | 43 | | | | | | 235 | q11 | p11 |
| 12 | 28 | 44 | | | | | | 236 | q12 | p12 |
| 13 | 29 | 45 | | | | | | 237 | q13 | p13 |
| 14 | 30 | 46 | | | | | | 238 | q14 | p14 |
| 15 | 31 | 47 | | | | | | 239 | q15 | p15 |
| 16 | 32 | 48 | | | | | | 240 | q16 | p16 |

| 18 | 34 | 37 | 54 | 79 | 87  | 113 | 133 | 145 | 169 | 182 | 203 | 210 | 125 | 236 |
| 4  | 35 | 51 | 62 | 84 | 94  | 116 | 130 | 146 | 161 | 177 | 197 | 220 | 1   | 225 |
| 16 | 21 | 52 | 68 | 76 | 99  | 107 | 129 | 143 | 158 | 240 | 195 | 211 | 138 | 231 |
| 12 | 28 | 38 | 69 | 85 | 90  | 117 | 121 | 148 | 156 | 186 | 190 | 212 | 208 | 226 |
| 7  | 27 | 44 | 53 | 86 | 102 | 105 | 134 | 149 | 166 | 180 | 199 | 206 | 96  | 229 |
| 3  | 24 | 41 | 57 | 83 | 103 | 119 | 131 | 144 | 162 | 183 | 200 | 213 | 193 | 237 |
| 14 | 32 | 40 | 66 | 72 | 98  | 120 | 136 | 150 | 159 | 173 | 192 | 216 | 176 | 179 |
| 9  | 29 | 46 | 58 | 81 | 89  | 112 | 137 | 153 | 167 | 181 | 201 | 209 | 75  | 227 |
| 5  | 26 | 42 | 60 | 71 | 95  | 106 | 126 | 154 | 170 | 184 | 202 | 217 | 39  | 239 |
| 2  | 19 | 43 | 55 | 74 | 101 | 109 | 122 | 151 | 171 | 187 | 196 | 218 | 67  | 228 |
| 13 | 31 | 49 | 61 | 82 | 91  | 114 | 135 | 147 | 164 | 188 | 204 | 214 | 104 | 232 |
| 10 | 30 | 45 | 64 | 73 | 97  | 108 | 128 | 140 | 163 | 175 | 205 | 219 | 155 | 235 |
| 6  | 22 | 47 | 56 | 78 | 88  | 110 | 124 | 139 | 157 | 185 | 191 | 221 | 224 | 234 |
| 15 | 20 | 36 | 63 | 70 | 93  | 118 | 123 | 152 | 168 | 174 | 189 | 222 | 23  | 238 |
| 11 | 33 | 50 | 65 | 77 | 100 | 111 | 132 | 142 | 165 | 178 | 198 | 207 | 17  | 233 |
| 8  | 25 | 48 | 59 | 80 | 92  | 115 | 127 | 141 | 160 | 172 | 194 | 215 | 230 | 223 |

SIGNAL PROCESSING METHOD AND SIGNAL PROCESSING CIRCUIT

CROSS-REFERENCES TO RELATED APPLICATIONS

This application relates to and claims priority from Japanese Patent Application No. 2003-207679, filed Aug. 18, 2003, the content of which is hereby incorporated by reference into this application.

BACKGROUND OF THE INVENTION

The present invention relates to a method of encoding data to be recorded in a recording and reproducing apparatus for encoding the data and recording the same in a recording medium, and performing reproduction and decoding thereof, and a signal processing method for obtaining error-reduced decoded data from a reproduced signal, and to a circuit thereof.

There has been an increasingly growing demand for high recording densification to a recording and reproducing apparatus, e.g., a magnetic disk device or hard disk drive (hereinafter called HDD) or the like. A signal processing technique of a recording and reproduction system that supports it has also been adapted to the high recording densification.

FIG. 2 shows one example of a data recording and reproducing processing circuit employed in the conventional HDD. In FIG. 2, recording data inputted to an input terminal 1 is subjected to error correction encoding by a symbol error correction encoder 10 on the recording side. The Reed-Solomon code (hereinafter called RS code) is often used as an error correcting code. Further, the signal is added with parity bits by a parity encoder 21 (it might be omitted). The signal is added with a sync signal or the like by a recording processing circuit 30, after which information is recorded in a recording medium 60 via a recording amplifier 40 and a recording head 50.

On the reproduction side, the signal read from the recording medium 60 by a reproducing head 150 is amplified by a reproducing amplifier 140. A reproducing processing circuit 130 effects sync signal detection or the like on the signal and inputs the so-processed signal to a parity decoder 121. The parity decoder 121 corrects a random error, using likelihood information and parities. Thereafter, a symbol error correction decoder 110 performs the correction of a code error such as a burst error due to a defect produced upon recording and playback and outputs the corrected signal to an output terminal 2.

A magnetic recording channel has a frequency response which can be made approximate by one in which a differential unit and a low-pass filter are connected in series. Assuming that D is defined as a delay operator at one time, the magnetic recording channel is configured such that interference among codes thereof is modeled as a partial response channel having an impulse response of $(1-D)(1+D)n$ (where $n=1, 2, 3, \ldots$).

In order to cope with such a channel, a Viterbi decoder is used for the reproducing processing circuit 130. The Viterbi decoder is used to carry out a maximum likelihood estimation of a transmission sequence in a band-restricted channel having code-to-code interference. That is, a code sequence for minimizing a distance metric related to the sequence of a received signal, such as the sum of square errors in the received signal sequence, for example, is selected from possible code sequences.

Conway, "A new target response with parity coding for high density magnetic recording channels," (1998) IEEE Trans. Magn, 34(4), pp. 2382-2386, has proposed a method of adding parity codes in fine cycles to correct random errors and correcting it using the parity information and likelihood information of a reproduced signal upon reproduction.

The parity correcting method was accompanied by the problem that an increase in the amount of recorded data and an increase in random error due to the speeding up of a data transfer rate could not be completely corrected, thus making it unable to ensure sufficient performance.

The Shannon limit given by the so-called Shannon's channel encoding theorem is known as a theoretical limit to code performance. Examples of an encoding method indicating the performance close to the Shannon limit include a coding/decoding method using Parallel Concatenated Convolutional Codes called turbo coding/decoding, which has been described in, for example, U.S. Pat. No. 5,446,747 (columns 7-10 and FIGS. 1-4). This will be described briefly here.

Encoding using the parallel concatenated convolutional codes is done by a device wherein two of a convolutional encoder and an interleaver are configured in parallel in concatenated form. Decoding of the parallel concatenated convolutional codes is performed by a device configured of two decoding circuits each of which outputs a soft-output. A transfer of information is performed between the two decoding circuits, whereby the final result of decoding is obtained.

There has also been known an encoding method using cascade concatenated convolutional codes without using the parallel concatenation. A method of combining the cascade concatenated convolutional codes with the RS code to thereby perform an error correction has been proposed in Japanese Patent Laid-open No. 2001-285080 (pages 9-11 and FIGS. 6 through 9). In this document, a modulation scheme for performing cascade concatenated convolutional coding for an internal code has been adopted for data subjected to RS coding as an external code. As to decoding, two-stage decoding of cascade concatenated codes is carried out. Thereafter, RS decoding is done. At this time, a determination unit for determining whether errors contained in decoded data exist in some degree, determined whether a lost correction should be done according to the determined reference (some of errors), outputted a lost flag to an RS decoder, and made a decision as to whether the normal error correction should be done according to the presence or absence of the lost flag or the lost correction should be done.

However, the parallel concatenated convolutional coding/decoding method and the cascade concatenated decoding method need redundant signals (redundant bits) for realizing the convolutional coding modulation scheme. As a result, a code rate loss occurs inevitably, and hence the total performance could not be enhanced sufficiently.

BRIEF SUMMARY OF THE INVENTION

Embodiments of the present invention provide a simple signal processing method and a signal processing circuit which need no extra redundant bits.

In accordance with an aspect of the present invention, a signal processing circuit comprises a symbol error correction encoding module for detecting/correcting errors in symbol units with respect to recording data, and a module for detecting/correcting errors in bit units upon decoding codes about the data from a reproduced signal. The module for detecting/correcting the errors in the bit units corrects the errors in the bit units on the basis of information about likelihood relative to data obtained by soft-determination decoding using part of a check matrix of symbol error correcting module, generates likelihood information in bit units, of a sequence containing errors, returns it to a partial response channel, newly continues channel decoding repeatedly and effects symbol error correction decoding on the resultant reproduced signal.

DETAILED DESCRIPTION OF THE INVENTION

Figure 1:
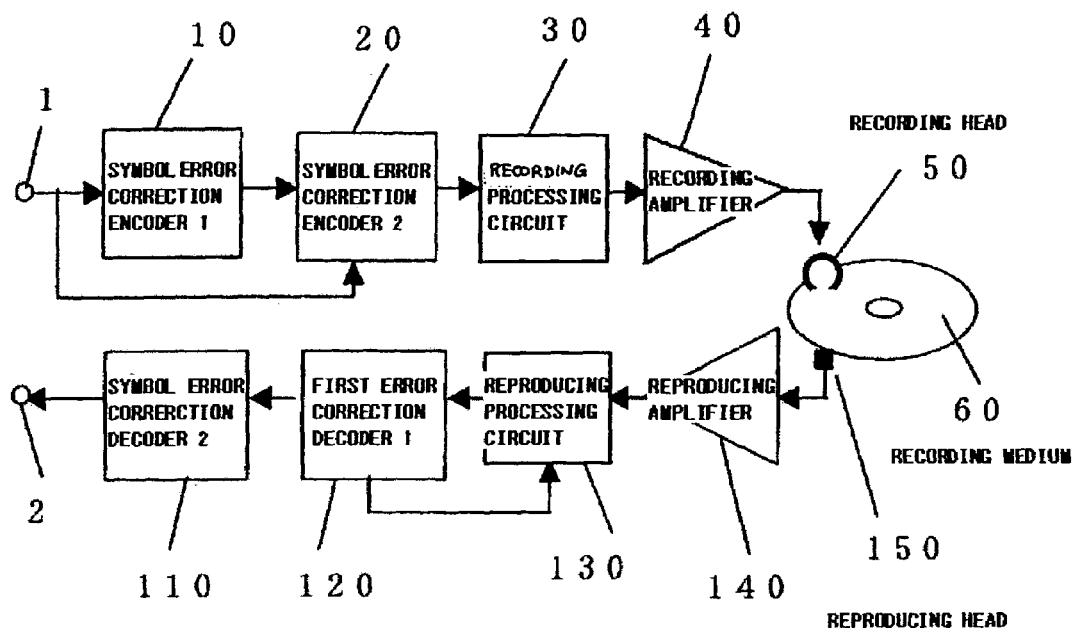
FIG. 1 is a configurational diagram of a magnetic recording and reproducing apparatus according to one embodiment of the present invention.
Figure 2:
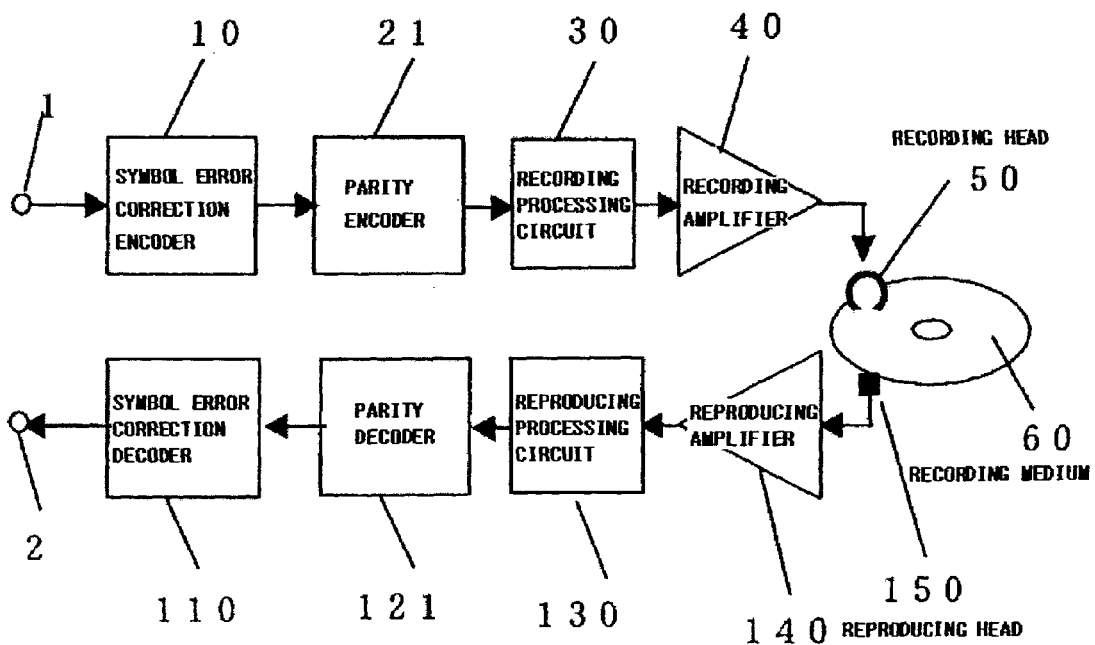
FIG. 2 is a configurational diagram of a conventional magnetic recording and reproducing apparatus.
Figure 3:
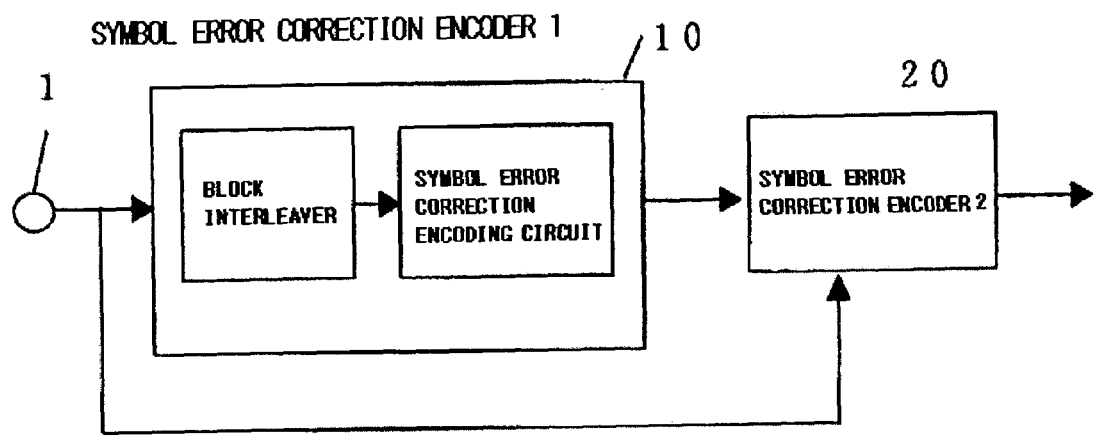
FIG. 3 is a configurational diagram of an encoding circuit according to one embodiment of the present invention.

A recording and reproducing apparatus according to one embodiment of the present invention will be explained with reference to the accompanying drawings. FIG. 1 shows a schematic configuration of a magnetic recording and reproducing apparatus. On the recording side, as shown in FIG. 3, recording data inputted to an input terminal 1 is block-interleaved in small block units by a symbol error correction encoder (1) 10, and is then subjected to first error correction encoding. For example, an RS code is used as an error-correcting code. Next, as shown in FIG. 1, a symbol error correction encoder (2) 20 effects encoding (e.g., RS encoding) on the whole block. The two data are switched and sent to a recording processing circuit 30. In the recording processing circuit 30, a sync signal or the like is added thereto, which in turn is inputted to a recording head 50 via a recording amplifier 40, so that information about the data is recorded in a recording medium 60.

Figure 4:
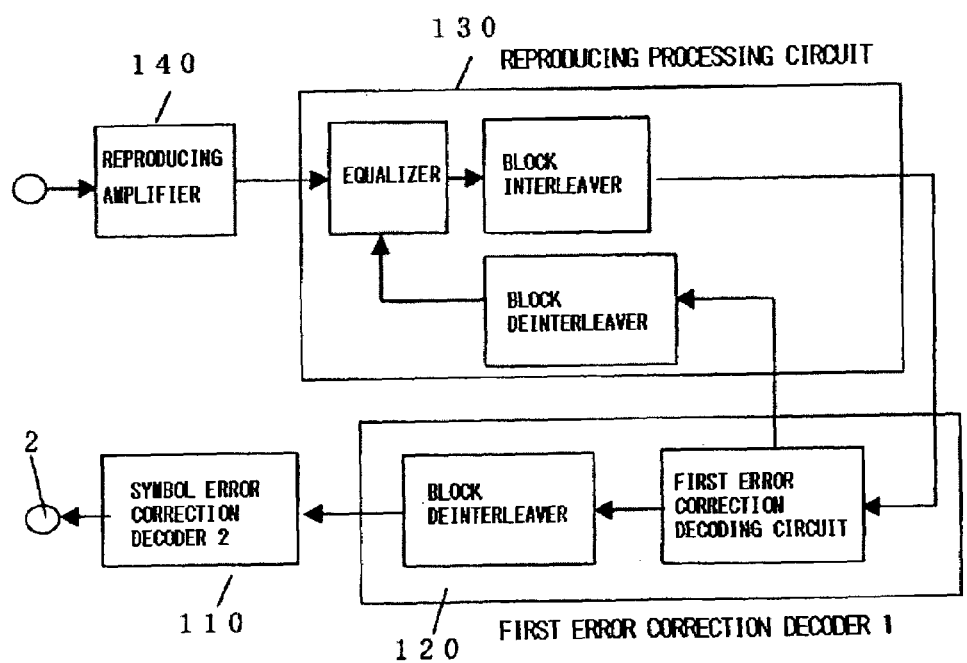
FIG. 4 is a configurational diagram of a decoding circuit according to one embodiment of the present invention.

On the reproducing side, a reproducing amplifier 140 amplifies a signal read from the recording medium 60 by a reproducing or playback head 150 and outputs it to a reproducing processing circuit 130. A structure of the reproducing processing circuit 130 is shown in FIG. 4 in further details. In the reproducing processing circuit 130, an equalizer first outputs likelihood information of respective bits, using a BCJR algorithm or a soft output Viterbi algorithm on the basis of a predetermined partial response signal.

Next, a first error correction decoder 120 corrects a random error produced upon recording and playback, using the likelihood information. Since repetitive decoding enables an improvement in performance with respect to the random error at this time, the post-correction data is returned to the reproducing processing circuit 130. A predetermined number of times or a value to which the value of the likelihood information is set, or the like, may be used to terminate such repetitive processing.

After the completion of the repetitive processing, the data is digitized and subjected to an error correction in symbol units, based on a hard determination, and is then outputted to a symbol error correction decoder (2) 110. Incidentally, a correction disable flag (lost flag) is simultaneously outputted in a block unit in the case of uncorrectability. Next, the symbol error correction decoder (2) 110 performs a hard determination error correction based on a normal RS code. At this time, a lost correction is effected on a block to which the lost flag from the first error correction decoder 120 is made, after which the final reproduced data is outputted to an output terminal 2.

A method of simply performing an error correction based on a hard decision by the first error correction decoder 120 and correcting an error that remains in the signal by the symbol error correction decoder (2) 110 can also be set up. The selection of either one of the data depends on the condition of errors of a magnetic disk device. When the number of errors is relatively low, a symbol error correcting process is executed and a bit error correction may be performed. On the other hand, when the number of errors increases, it is prudent to carry out a bit error correction beforehand.

Figures 5, 6:
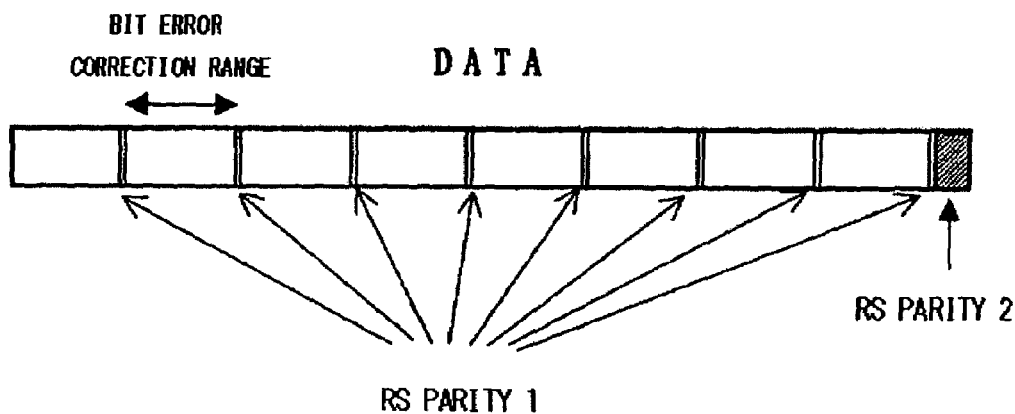
FIG. 5 is a diagram showing the layout of Reed-Solomon codes in a sector, according to one embodiment of the present invention.
FIG. 6 is a diagram showing one example of a conventional block interleaver.

A bit error correcting process will be explained below in detail. FIG. 5 shows the relationship between data of error correction codes using the present embodiment and their parities. Inspection or check data (parity) of a symbol error correcting code (e.g., RS code) is calculated with respect to input data and then added to the corresponding data. In FIG. 5, the check data is normally collectively added to the rearmost portion of the data as shown in an RS parity 2 in FIG. 5. On the other hand, as shown in RS parities 1, the addition of data every relatively short data sequences is also effective in improving bit error correcting capability simultaneously with a reduction in the circuit scale of the first error correction decoder (1) 120 or the like.

Although the present embodiment is basically applicable even in both cases, a description will be made of a case in which both the RS parities 1 short in cycle and the RS parity 2 are used as shown in FIG. 5, in view of a practically easy point. A case in which they are applied to a 4096-bit sector format used in the existing magnetic disk device is shown as a specific example. RS codes computable on $GF(2^{10})$ can be utilized to add RS parities to 4096-bit length data, for example. That is, one symbol results in a configuration of 10 bits. Assuming now that the number of input data is K (symbol) and the number of parities of RS codes to be added is M (symbol), the maximum correctable number of symbols results in an M/2 symbol.

A description will be made below of, as one example, an example (maximum correctable number of bits: 250 bits) in which the maximum correctable number of symbols (M/2) is 25 symbols and one symbol is 10 bits. However, the present invention is not limited to such numerals. In order to enable a correction of 25 symbols, the total number of RS parities needs 50 symbols. Now consider that 34 symbols are assigned to the RS parity 1 and 16 symbols are allocated to the RS parity 2. Thus, it is possible to allocate the RS parities 1 to data set every about 24 symbols in the form of 2 symbols. Here, a check matrix h of RS codes each having a redundant bit of 2 symbols is given by the following equation.

$$h = \begin{bmatrix} e & e & e & e & \ldots & \ldots & e & e & e & e \\ e & \alpha & \alpha^2 & \alpha^3 & \ldots & \ldots & \alpha^{22} & \alpha^{23} & \alpha^{24} & \alpha^{25} \end{bmatrix} \quad (1)$$

where $\alpha$ and e indicate a primitive source and a unit source respectively. The unit source can be expressed in a so-called unit matrix with 10 rows×10 columns. Assuming that parities of 2 symbols are defined as P and Q respectively and data of 24 symbols are D1, D2 . . . . D24 respectively, the following relationship is established:

$$h \cdot [PQD_1 \ldots D_{24}] = 0 \quad (2)$$

The upper stage of the check matrix is made up of the unit matrix alone. This results in the fact that simple parties of 10 rows are constituted with respect to a signal sequence composed of the 24 symbols of the original data sequence and the RS parity 1 of 2 symbols. That is, it can be assumed that simply-parity's restrictions are respectively imposed on 10 sequences in which the data of the signal sequence constituted of the 24 symbols of the original data sequence and the RS parity 1 of the 2 symbols are selected every 10 bits.

The first error correction decoder 120 shown in FIG. 1 generates a bit error correction and likelihood information relative to each bit, using the property of each RS code. The simple parity belongs to the simplest class of block error correcting codes. It is now well known that the generation of likelihood with respect to such a simple parity is made possible by using a Belief Propagation Algorithm (hereinafter abbreviated as BPA).

Now, one example of a data array or sequence of 24 symbols, i.e., 240 bits, is shown in FIG. 6. In the present example, 240-bit data are represented as the contents of a matrix with 16 rows and 15 columns, and redundant bits of RS codes are arranged in the 16th and 17th columns. Thus, respective parity restrictions are added in a row direction. Under an even parity restriction as well known, an odd-number of errors can be detected with respect to data lying within a restricted range but an even-number of errors cannot be detected.

This characteristic remains unchanged even if the BPA is used in detection. That is, when the even number of errors are contained, data about likelihood cannot be extracted either to say nothing of a required error correction. An EEPR4 channel heavily used in a magnetic disk is a partial response channel that has an impulse response of $(1-D)(1+D)^n$ (where n=3). In the EEPR4 channel, a 3-bit continuous error mainly occurs with respect to white noise.

When two 3-bit continuous errors occur so as to overlap each other as indicated by diagonally shaded portions of FIG. 6, the errors can be neither detected nor corrected by the simple parity. Thus, the randomization of data in such a manner that at least one bit of the two 3-bit continuous errors does not overlap, is extremely effective in improving detection performance. Now consider where information obtained from the data arranged in this way by BPA is returned to the partial response channel.

There is a high possibility that if even one bit of the continuous error produced in the partial response channel can be decoded properly, then a continuous error due to a pass selection miss of a CHAPP (Channel Output Posterior Probability computing unit) that executes a BCJR algorithm can be corrected. Assuming that the number of rows of a matrix that meets such a condition is m and the number of columns thereof is n, the following equation results in a condition necessary for m and n:

$$_m C_3 - mn \geqq 0 \quad (3)$$

Figures 7, 8:
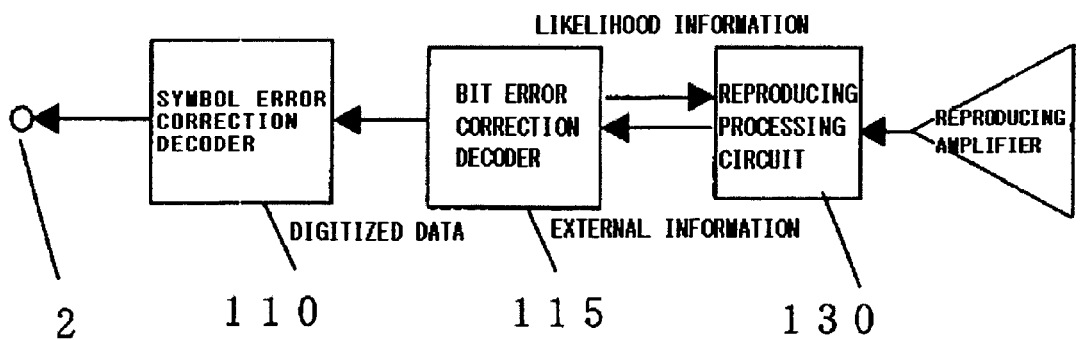
FIG. 7 is a diagram illustrating a block interleaver according to one embodiment of the present invention.
FIG. 8 is a diagram for describing a configuration of repetition decoding according to one embodiment of the present invention.

Thus, the present embodiment will consider such a parity structure that m and n perfectly satisfy the condition. One example of a parity matrix that meets the condition is actually shown in FIG. 7. As is understood from the drawing, the parity structure takes a structure that interleaves data. That is, the data are interleaved as shown in FIG. 7 in advance before RS encoding and encoded. Similar interleaving is effected even on parities of P and Q obtained as its result, thus enabling complete detection of at least two 3-bit continuous errors in the case of at least the two 3-bit continuous errors.

Even when one 3-bit continuous error extends over two columns, at least one bit can be detected. Since one symbol length of a RS code takes 10 bits here, redundant symbols of P and Q are added to data corresponding to 10 rows in the above interleaver matrix. Accordingly, data corresponding to the remaining 11 to 16 rows are allocated to the following redundant symbol. Of course, it is also possible to cause all of 16 rows and 17 columns to correspond to one RS code sequence by RS codes of $GF(2^{16})$. Incidentally, although such a restriction as expressed in the equation (3) takes into consideration an error whose frequency of occurrence is high in EEPR4, it is apparent that a similar idea can be applied even to other partial responses. The interleave processing described up to now is performed in advance by the symbol error correction encoder 10 before recording.

An example in which a symbol error correction is executed after a bit error correction, is shown in FIG. 8. Likelihood information of respective bits obtained in a reproducing processing circuit 130 is inputted to a bit error correcting circuit 115. The likelihood information can be generated using the BCJR algorithm or the soft output Viterbi algorithm on the basis of a predetermined partial response signal as mentioned above. The bit error correcting circuit 115 updates the likelihood information of the respective bits, using a check matrix corresponding to simple parities, of check matrices of RS codes according to BPA.

The original data sequence can be restored by digitizing the likelihood information of the respective bits. However, errors might be contained therein. Thus, the bit error correcting circuit 115 generates external information corresponding to the likelihood information of each bit obtained in the reproducing processing circuit 130 according to BPA. The external information corresponds to likelihood information of a given bit derived from other bits by satisfying each parity restriction. Newly adding it to the likelihood information of each bit obtained in the reproducing processing circuit 130 makes it possible to significantly improve the reliability of the bits.

Repeating this process below can further enhance the reliability of the bits. If an error contained in a data sequence reaches less than or equal to one symbol in this process, then the error can be corrected by using the parity of RS1. Of course, a mechanism for determining as to whether the error reaches one less than or equal to one symbol after the repetition of the process is not provided in general. Now consider where a body for computing each RS code is assumed to be $GF(2^{10})$. Codes having lengths of 1023 symbols at the maximum can be realized on the body.

On the other hand, the actual code length is set to 24 symbols. Thus, syndromes up to $\alpha^{25}$ occur as is apparent from the check matrix of the equation (1). However, if errors occur in plural bits, then there is a possibility that syndromes from $\alpha$ to $\alpha^{1023}$ will occur. Thus, the value of the syndrome is examined upon execution of a correction based on an RS code. When the value greater than or equal to $\alpha^{25}$ occurs, the correction is inhibited to thereby make it possible to reduce an increase in error due to a so-called erroneous correction (miscorrection) of a correct code.

The data of the first error correction decoder 120 is corrected by the symbol error correction decoder (2) 110 and thereafter outputted from the terminal 2.

Although the above description has been provided for a longitudinal recording system, it is needless to say that the present invention is applicable under a substantially similar configuration even in the case of a vertical recording system.

A reproduced waveform in a longitudinal magnetic recording channel is modeled as a partial response channel having an impulse response of $(1-D)(1+D)^n$ (where n=1, 2, 3, ...).

In contrast, a reproduced waveform in a vertical magnetic recording channel is modeled as a partial response channel having an impulse response of $(1+D)^n$ (where n=1, 2, 3, ...). Although there is a method of processing it as it is, waveform equalization of a reproducing processing circuit simply changes. It is also possible to perform processing similar to that in the longitudinal recording system through a differentiation circuit. That case can be processed by the method described in the embodiment.

According to embodiments of the present invention, as described above, likelihood information of a data sequence is generated using the redundancy of each RS code with respect to an increase in random error with high-density recording and the speeding up of a data transfer rate. This is added to a posterior probability decoder of a reproducing circuit again, where the likelihood information of the data sequence is updated. By repeatedly performing it, errors contained in data are reduced. Thus, a decoding method suitable for high-density recording can be provided which is capable of ensuring performance sufficiently without adding extra redundant signals other than the RS codes.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A signal processing method for encoding and recording information and decoding original information from a reproduced signal, comprising:
    calculating and adding codes for detecting/correcting errors in symbol units upon encoding of the recorded information;
    when the recorded information is decoded from the reproduced signal, generating likelihood information of the information simultaneously with the decoded information;
    soft-determining the decoded information, using a part of a check matrix with respect to redundancies of the error correcting codes in the symbol units; and
    repeating the generation of the likelihood information and the soft-determination of the decoded information, and thereafter hard-determining the errors in the symbol units.

2. The signal processing method according to claim 1, wherein calculating and adding the codes for detecting/correcting the errors in the symbol units comprises:
    adding a redundancy of each error correcting code of the symbol unit in a short cycle; and
    adding a redundancy of each error correcting code in a long cycle, and wherein soft-determining the decoded information uses a part of the check matrix with respect to the redundancy in the short cycle.

3. The signal processing method according to claim 1, wherein the likelihood information is used in soft-determining the decoded information, wherein the result of the soft determination is fed back to generating the likelihood information, and wherein decoding is done by performing the generation of the likelihood information and soft determination of the decoded information.

4. A signal processing circuit for encoding and recording information and decoding original information from a reproduced signal, comprising:
    error correction encoding means for calculating/adding codes for detecting/correcting errors in symbol units upon encoding of the recorded information;
    reproducing means for, when the recorded information is decoded from the reproduced signal, generating likelihood information of the information simultaneously with the decoded information;
    soft-determination decoding means for performing a soft determination, using a part of a check matrix with respect to redundancies of the error correcting codes in the symbol units; and
    means for repeating decoding processes of generating the likelihood information and soft-determining the decoded information to restore data and thereafter detecting/correcting the errors in the symbol units by a hard determination.

5. The signal processing circuit according to claim 4, wherein the soft-determination decoding means determines an order of an erroneous syndrome and stops execution of an error correction in a predetermined order or more.

6. The signal processing circuit according to claim 4, wherein the error correction encoding means has means for adding a redundancy of each error correcting code of the symbol unit in a short cycle and means for adding a redundancy of each error correcting code in a long cycle, and wherein the soft-determination decoding means performs a soft determination, using a part of the check matrix with respect to the redundancy in the short cycle.

7. The signal processing circuit according to claim 6, wherein the soft-determination decoding means performs a lost correction where the result of the error correction and decoding in the short cycle indicates uncorrectability, and outputs an uncorrectability flag to a long-cycle error correction decoding means.

8. The signal processing circuit according to claim 6, wherein data aimed by the means for adding the redundancy of each error correcting code of the symbol unit in the short cycle includes an interleaver for dispersing continuous errors produced by partial response processing.

9. The signal processing circuit according to claim 4, further including means for feeding back likelihood information of the decoded information between the soft-determination decoding means and the reproducing means; wherein soft-determining the decoded information, generating the likelihood information of the decoded information, and feeding back of the likelihood information of the decoded information are operated repeatedly to carry out decoding.

10. The signal processing circuit according to claim 9, wherein the likelihood information from the soft-determination decoding means is fed back to the reproducing means at least once.

11. A signal processing circuit for encoding and recording information and decoding original information from a reproduced signal, comprising:
an error correction encoder configured to calculate/add codes for detecting/correcting errors in symbol units upon encoding of the recorded information;
a reproducing module configured, when the recorded information is decoded from the reproduced signal, to generate likelihood information of the information simultaneously with the decoded information;
a first error correction decoder configured to performing a soft determination, using a part of a check matrix with respect to redundancies of the error correcting codes in the symbol units; and
a mechanism coupled between the reproducing module and the first error correction decoder to repeat decoding processes of generating the likelihood information and soft-determining the decoded information to restore data;
wherein the errors in the symbol units are corrected by a hard determination after completion of the repeated decoding processes.

12. The signal processing circuit according to claim 11, wherein the first error correction decoder is configured to determine an order of an erroneous syndrome and stop execution of an error correction in a predetermined order.

13. The signal processing circuit according to claim 11, wherein the error correction encoder is configured to add a redundancy of each error correcting code of the symbol unit in a short cycle and to add a redundancy of each error correcting code in a long cycle, and wherein the first error correction decoder is configured to perform a soft determination, using a part of the check matrix with respect to the redundancy in the short cycle.

14. The signal processing circuit according to claim 13, further comprising a second error detection decoder, and wherein the first error correction decoder is configured to perform a lost correction where the result of the error correction and decoding in the short cycle indicates uncorrectability, and to output an uncorrectability flag to the second error correction decoder.

15. The signal processing circuit according to claim 11, wherein the mechanism coupled between the reproducing module and the first error correction decoder is configured to feed back likelihood information of the decoded information between the first error correction decoder and the reproducing module; wherein soft-determining the decoded information, generating the likelihood information of the decoded information, and feeding back of the likelihood information of the decoded information are operated repeatedly to carry out decoding.

16. The signal processing circuit according to claim 15, wherein the likelihood information from the first error correction decoder is fed back to the reproducing module at least once.

17. The signal processing circuit according to claim 11, wherein the first error correction decoder is configured to correct a random error produced upon recording using the likelihood information from the reproducing module to generate post-correction data, and wherein the mechanism coupled between the reproducing module and the first error correction decoder is configured to return the post-correction data from the first error correction decoder to the reproducing module to repeat generating the likelihood information based on the post-correction data and providing the generated likelihood information to the first error correction decoder.

18. The signal processing circuit according to claim 11 further comprising a second error correction decoder configured to receive the data from the first error correction decoder after error correction of the data by the first error correction decoder, and to perform a hard determination error correction of the data.

19. The signal processing circuit according to claim 11 wherein the first error correction decoder comprises a bit error correction decoder configured to perform a bit error correction of the data based on the likelihood information from the reproducing module and to generate external information corresponding to the likelihood information from the reproducing module; and wherein the mechanism coupled between the reproducing module and the first error correction decoder is configured to return the external information from the first error correction decoder to the reproducing module to repeat generating the likelihood information based on the external information and providing the generated likelihood information to the first error correction decoder.

20. The signal processing circuit according to claim 19 further comprising a second error correction decoder which is a symbol error correction decoder configured to receive the data from the first error correction decoder after error correction of the data by the first error correction decoder, and to perform a symbol error correction of the data.

* * * * *